(12) United States Patent
Sasaki et al.

(10) Patent No.: US 10,438,641 B2
(45) Date of Patent: Oct. 8, 2019

(54) DATA WRITING METHOD AND MAGNETIC MEMORY

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/068,523

(22) PCT Filed: Feb. 1, 2018

(86) PCT No.: PCT/JP2018/003435
§ 371 (c)(1),
(2) Date: Jul. 6, 2018

(65) Prior Publication Data
US 2019/0237119 A1 Aug. 1, 2019

(51) Int. Cl.
| G11C 11/16 | (2006.01) |
| G11C 11/18 | (2006.01) |
| G11C 7/04 | (2006.01) |
| G01R 33/09 | (2006.01) |
| H01L 27/22 | (2006.01) |

(52) U.S. Cl.
CPC ........ *G11C 11/1675* (2013.01); *G01R 33/098* (2013.01); *G11C 7/04* (2013.01); *G11C 11/161* (2013.01); *G11C 11/1673* (2013.01); *G11C 11/18* (2013.01); *H01L 27/228* (2013.01)

(58) Field of Classification Search
CPC .... G11C 11/161; G11C 11/1675; G11C 11/18
USPC ........................................ 365/158, 171, 173
See application file for complete search history.

(56) References Cited

U.S. PATENT DOCUMENTS

| 8,350,347 | B2 | 1/2013 | Gaudin et al. |
| 2014/0070896 | A1* | 3/2014 | Tulapurkar .......... H03B 15/006 |
| | | | 331/94.1 |
| 2015/0348606 | A1 | 12/2015 | Buhrman et al. |
| 2017/0126249 | A1* | 5/2017 | Wu ....................... H03M 13/05 |
| 2017/0222135 | A1 | 8/2017 | Fukami et al. |

FOREIGN PATENT DOCUMENTS

WO 2016/021468 A1 2/2016

OTHER PUBLICATIONS

S. Fukami et al.; "A spin-orbit torque switching scheme with collinear magnetic easy axis and current configuration"; Nature Nanotechnology (2016); DOI: 10.1038/NNANO.2016.29; Published Mar. 21, 2016.

(Continued)

*Primary Examiner* — Han Yang
(74) *Attorney, Agent, or Firm* — Oliff PLC

(57) ABSTRACT

A data writing method according to an aspect is configured such that a spin-orbit torque-type magnetoresistance effect element includes: a spin-orbit torque wire extending in a first direction; and a functional portion having a first ferromagnetic layer, a non-magnetic layer, and a second ferromagnetic layer stacked on one surface of the spin-orbit torque wire in that order from the spin-orbit torque wire, wherein a voltage applied in the first direction of the spin-orbit torque wire is equal to or higher than a critical writing voltage at an environmental temperature and is equal to or lower than a predetermined value.

13 Claims, 7 Drawing Sheets

(56) References Cited

OTHER PUBLICATIONS

Y.K. Kato et al.; "Observation of the Spin Hall Effect in Semiconductors"; Science vol. 306; pp. 1910-1913; DOI: 10.1126/science.1105514; Dec. 10, 2004.
I.M. Miron et al.; "Perpendicular switching of a single ferromagnetic layer induced by in-plane current injection"; Nature vol. 476; pp. 189-193; Aug. 11, 2011.
L. Liu et al.; "Spin torque switching with the giant spin Hall effect of tantalum"; Science, 336, 555; DOI: 10.1126/science,1218197; Submitted Mar. 13, 2012.
L. Liu et al.; "Current-Induced Switching of Perpendicularly Magnetized Magnetic Layers Using Spin Torque from the Spin Hall Effect"; Physical Review Letters; 109, pp. 096602-1-096602-5; Aug. 2012.
KS. Lee et al.; "Threshold current for switching of a perpendicular magnetic layer induced by spin Hall effect"; Applied Physics Letters 102, pp. 112410-1-112410-5; Published Mar. 20, 2013.
KS. Lee et al.; "Thermally activated switching of perpendicular magnet by spin-orbit spin torque"; Applied Physics Letters 104, 072413; Published Feb. 21, 2014; doi: 10.1063/1.4866186.
S. Fukami et al.; "Magnetization switching by spin-orbit torque in an antiferromagnet-ferromagnet bilayer system"; Nature Materials; vol. 15; pp. 535-541; Published Feb. 15, 2016.
S. Takahashi et al.; "Spin injection and detection in magnetic nanostructures"; Physical Review B 67, pp. 052409-1-052409-4; Published Feb. 28, 2003.
Y. Seo et al.; "Area-Efficient SOT-MRAM With a Schottky Diode"; IEEE Electron Device Letters; vol. 37, No. 8, pp. 982-985; Aug. 2016.
W. Zhang et al.; "Spin Hall Effects in Metallic Antiferromagnets"; Physical Review Letters, 113; pp. 196602-1-196602-6; Published Nov. 4, 2014.

\* cited by examiner

DATA WRITING METHOD AND MAGNETIC MEMORY

TECHNICAL FIELD

The present invention relates to a data writing method and a magnetic memory.

BACKGROUND ART

As a device which uses a change in resistance (change in magneto-resistance) based on a change in a relative angle of magnetization of two ferromagnetic layers, a giant magneto-resistance (GMR) device formed of a multi-layer film including a ferromagnetic layer and a non-magnetic layer, a tunneling magneto-resistance (TMR) device in which an insulating layer (a tunneling barrier layer, a barrier layer) is used for a non-magnetic layer, and the like are known.

MRAM reads and writes data using characteristics that a device resistance of a GMR device or a TMR device changes when the directions of magnetization of two ferromagnetic layers having an insulating layer disposed therebetween change. As a writing method of MRAM, a method of performing writing (magnetization reversal) using a magnetic field created by a current and a method of passing current in a stacking direction of magnetoresistance effect elements to perform writing (magnetization reversal) using a spin-transfer torque (STT) generated by the current are known.

In magnetization reversal of a magnetoresistance effect element using an STT, it is necessary to pass a current in a stacking direction of the magnetoresistance effect elements when writing data. A writing current may sometimes cause the characteristics of magnetoresistance effect elements to deteriorate.

Therefore, in recent years, methods which do not require passing a current in a stacking direction of magnetoresistance effect elements during writing have drawn attention. One of these methods is a writing method which uses a spin-orbit torque (SOT) (for example, see Non-Patent Literature 1). An SOT is induced by a pure spin current generated by the spin-orbit interaction or by the Rashba effect at the interface between different materials. A current for inducing an SOT in a magnetoresistance effect element is passed in a direction crossing the stacking direction of magnetoresistance effect elements. That is, since it is not necessary to pass a current in the stacking direction of these magnetoresistance effect elements, the service life of the magnetoresistance effect elements is expected to be able to be extended.

CITATION LIST

Non-Patent Literature

[Non-Patent Literature 1]
S. Fukami, T. Anekawa, C. Zhang and H. Ohno, Nature Nano Tec (2016). DOI:10.1038/NNANO. 2016. 29.

SUMMARY OF INVENTION

Technical Problem

In magnetic memories, a magnetoresistance effect element records data. In order to secure sufficient reliability of recorded data, it is required that a write error rate of a magnetoresistance effect element be $10^{-7}$ or lower.

As described above, a spin-orbit torque-type magnetoresistance effect element that writes data using an SOT does not pass a current in the stacking direction of magnetoresistance effect elements. Due to this, it is substantially unnecessary to take the electrical breakdown of magnetoresistance effect elements into consideration, and in principle, it is possible to pass a large writing current. When the amount of the applied writing current increases, a number of spins are injected into a ferromagnetic material of the magnetoresistance effect element. That is, it is understood that by passing a large writing current, it is possible to further decrease a write error rate of a magnetoresistance effect element.

However, as a result of intensive study of the present inventors, it was found that, if a voltage or a current not less than a predetermined value is applied to a spin-orbit torque-type magnetoresistance effect element, the write error rate of the magnetoresistance effect element deteriorates.

The present invention has been made in view of the above-described problems, and an object thereof is to provide a data writing method capable of writing data stably in a magnetic memory. Moreover, another object of the present invention is to provide a magnetic memory capable of writing data stably.

Solution to Problem

That is, the invention provides the following means in order to solve the above-mentioned problems.

(1) A data writing method according to a first aspect is configured such that a spin-orbit torque-type magnetoresistance effect element includes: a spin-orbit torque wire extending in a first direction; and a functional portion having a first ferromagnetic layer, a non-magnetic layer, and a second ferromagnetic layer stacked on one surface of the spin-orbit torque wire in that order from the spin-orbit torque wire, wherein a voltage applied in the first direction of the spin-orbit torque wire is equal to or higher than a critical writing voltage at an environmental temperature and is equal to or lower than a predetermined value, and the predetermined value is set such that: when the environmental temperature is −40° C., 20° C., and 100° C., the predetermined value is a limit writing voltage at which a write error rate when a magnetization of the first ferromagnetic layer is reversed is equal to a write error rate when the critical writing voltage is applied; when the environmental temperature is in a temperature region of lower than 20° C., the predetermined value is a voltage positioned on a straight line connecting a limit writing voltage at −40° C. to a limit writing voltage at 20° C.; and when the environmental temperature is in a temperature region of 20° C. or higher, the predetermined value is a voltage positioned on a straight line connecting a limit writing voltage at 20° C. and a limit writing voltage at 100° C.

(2) In the data writing method according to the above aspect, when the environmental temperature is in the temperature region of 20° C. or higher, a voltage that is 1.01 or more times the critical writing voltage at 20° C. may be applied in the first direction of the spin-orbit torque wire during data writing, and when the environmental temperature is in the temperature region of lower than 20° C., a voltage that is 1.05 or more times the critical writing voltage at 20° C. may be applied in the first direction of the spin-orbit torque wire during data writing.

(3) In the data writing method according to the above aspect, when the environmental temperature is 20° C. or higher, a voltage that is equal to or higher than the critical writing voltage at the environmental temperature and is 1.65 or less times the critical writing voltage at 20° C. may be applied in the first direction of the spin-orbit torque wire during data writing, and when the environmental temperature is lower than 20° C., a voltage that is equal to or higher than the critical writing voltage at the environmental temperature and is 1.54 or lower times the critical writing voltage at 20° C. may be applied in the first direction of the spin-orbit torque wire during data writing.

(4) In the data writing method according to the above aspect, when data is written in a temperature region of −40° C. or higher and 100° C. or lower, a voltage that is 1.2 times or more and 1.54 or lower times the critical writing voltage may be applied in the first direction of the spin-orbit torque wire.

(5) In the data writing method according to the above aspect, the spin-orbit torque wire may be tungsten, if the critical writing voltage at 20° C. is $V_0$ and the environmental temperature is t (° C.), when the environmental temperature is in the temperature region of lower than 20° C., the predetermined value V may satisfy:

$$V=(2.0\times10^{-3}\times t+1.62)\times V_0,$$

and when the environmental temperature is in the temperature region of 20° C. or higher, the predetermined value may satisfy:

$$V=(1.3\times10^{-3}\times t+1.635)\times V_0.$$

(6) In the data writing method according to the above aspect, the spin-orbit torque wiring may be tantalum, if the critical writing voltage at 20° C. is $V_0$ and the environmental temperature is t (° C.), when the environmental temperature is in the temperature region of lower than 20° C., the predetermined value V may satisfy:

$$V=(0.8\times10^{-3}\times t+1.63)\times V_0,$$

and when the environmental temperature is in the temperature region of 20° C. or higher, the predetermined value may satisfy:

$$V=1.65\times V_0.$$

(7) In the data writing method according to the above aspect, the spin-orbit torque wiring may be iridium, if the critical writing voltage at 20° C. is $V_0$ and the environmental temperature is t (° C.), when the environmental temperature is in the temperature region of lower than 20° C., the predetermined value V may satisfy:

$$V=(0.2\times10^{-3}\times t+1.7167)\times V_0,$$

and when the environmental temperature is in the temperature region of 20° C. or higher, the predetermined value may satisfy:

$$V=(1.9\times10^{-3}\times t+1.6825)\times V_0.$$

(8) In the data writing method according to the above aspect, the spin-orbit torque wiring may be platinum, if the critical writing voltage at 20° C. is $V_0$ and the environmental temperature is t (° C.), when the environmental temperature is in the temperature region of lower than 20° C., the predetermined value V may satisfy:

$$V=(0.8\times10^{-3}\times t+1.6333)\times V_0,$$

and when the environmental temperature is in the temperature region of 20° C. or higher, the predetermined value may satisfy:

$$V=(0.3\times10^{-3}\times t+1.645)\times V_0.$$

(9) A magnetic memory according to a second aspect is a magnetic memory including: a spin-orbit torque wiring extending in a first direction; a functional portion having a first ferromagnetic layer, a non-magnetic layer, and a second ferromagnetic layer stacked on one surface of the spin-orbit torque wiring in that order from the spin-orbit torque wiring; and a voltage source that is connected to the spin-orbit torque wiring and applies a voltage that is equal to or higher than a critical writing voltage at an environmental temperature and is equal to or lower than a predetermined value in the first direction, wherein the predetermined value is set such that: when the environmental temperature is −40° C., 20° C., and 100° C., the predetermined value is a limit writing voltage at which a write error rate when a magnetization of the first ferromagnetic layer is reversed is equal to a write error rate when the critical writing voltage is applied; when the environmental temperature is in a temperature region of lower than 20° C., the predetermined value is a voltage positioned on a straight line connecting a limit writing voltage at −40° C. to a limit writing voltage at 20° C.; and when the environmental temperature is in a temperature region of 20° C. or higher, the predetermined value is a voltage positioned on a straight line connecting a limit writing voltage at 20° C. and a limit writing voltage at 100° C.

(10) The magnetic memory according to the above aspect may further include: a thermometer that is connected to the spin-orbit torque wiring to convert a resistance of the spin-orbit torque wiring to a temperature of the spin-orbit torque wiring.

Advantageous Effects of Invention

According to the data writing method and the magnetic memory of the present embodiment, it is possible to write data stably.

DESCRIPTION OF EMBODIMENTS

Figure 1:
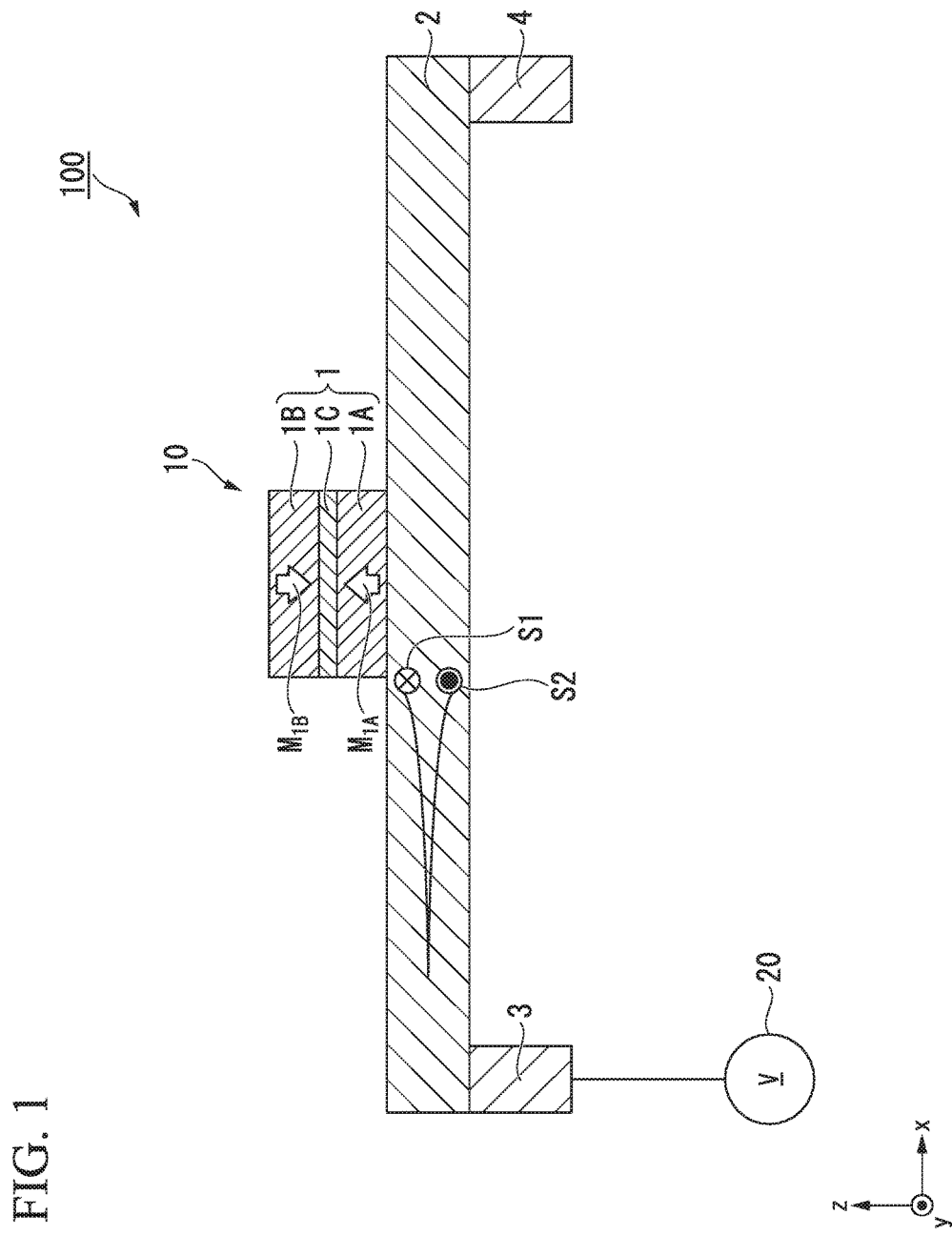
FIG. 1 is a schematic diagram of a magnetic memory according to the present embodiment.

Hereinafter, the present embodiment will be described in detail with reference to the drawings. In the drawings used in the following description, in some cases, characteristic portions are enlarged for ease of understanding of the characteristics of the invention and the dimensional proportions of each component may be different from the actual dimensions and scale. The materials and dimensions exemplified in the following description are examples only and the present invention is not limited thereto. The materials and dimensions can be changed appropriately within a range where the advantageous effects of the present invention are achieved.

(Magnetic Memory)

FIG. 1 is a schematic diagram of a magnetic memory 100 according to the present embodiment. The magnetic memory 100 includes a spin-orbit torque-type magnetoresistance effect element 10 and a voltage source 20.

<Spin-Orbit Torque-Type Magnetoresistance Effect Element>

The spin-orbit torque-type magnetoresistance effect element 10 includes a functional portion 1 and a spin-orbit torque wiring 2. A first electrode 3 and a second electrode 4 having conductive properties are provided at positions between which the functional portion 1 of the spin-orbit torque wiring 2 is interposed. The first and second electrodes 3 and 4 are connected directly to the spin-orbit torque wiring 2 and may be connected via an insulating layer. When these electrodes are connected directly to the spin-orbit torque wiring 2, the magnetoresistance effect element is current-driven. When these electrodes are connected to the spin-orbit torque wiring 2 via an insulator, the magnetoresistance effect element is voltage-driven.

Hereinafter, a first direction along which the spin-orbit torque wiring 2 extends is defined as the x direction, a stacking direction (a second direction) of the functional portion 1 is defined as the z direction, and the direction orthogonal to the x direction and the z direction is defined as the y direction.

[Spin-Orbit Torque Wiring]

The spin-orbit torque wiring 2 extends in the x direction. The spin-orbit torque wiring 2 is connected to one surface of the functional portion 1 facing in the z direction. The spin-orbit torque wiring 2 and the functional portion 1 may be connected directly to each other and may be connected with another layer disposed therebetween.

The spin-orbit torque wiring 2 is formed of a material that generates a spin current due to the spin Hall effect when a current I flows. As an example of such a material, a material that generates a spin current in the spin-orbit torque wiring 2 may be used. Therefore, such a material is not limited to a material made up of a single element, and a material including a portion formed of a material that easily generates a spin current and a portion formed of a material that does not easily generate a spin current may be used.

The spin Hall effect is a phenomenon that, when a current I is passed through a material, a spin current is induced in a direction orthogonal to the direction of the current I on the basis of the spin-orbit interaction. A mechanism in which a spin current is generated by the spin Hall effect will be described.

When a potential difference is applied across both ends of the spin-orbit torque wiring 2, a current I flows along the spin-orbit torque wire 2. When the current I flows, a first spin S1 oriented in one direction and a second spin S2 oriented in a direction opposite from the first spin S1 are bent in a direction orthogonal to the current. For example, the first spin S1 may be bent in the z direction with respect to an advancing direction, and the second spin S2 may be bent in the −z direction with respect to an advancing direction.

A general Hall effect and the spin Hall effect are the same in that moving (traveling) charge (electrons) is bent in the moving (traveling) direction. On the other hand, the two effects are greatly different in that the normal Hall effect is that charged particles moving in a magnetic field receive a Lorentz force and are bent in the moving direction whereas the spin Hall effect is that, even when a magnetic field is not present, a traveling direction of a spin is bent due to traveling of electrons (the flow of a current).

In non-magnetic materials (materials that are not ferromagnetic materials), since the number of electrons of the first spin S1 is the same as the number of electrons of the second spin S2, the number of electrons of the first spin S1 oriented in the +z direction in the drawing is the same as the number of electrons of the second spin S2 oriented in the −z direction. In this case, the flows of charge cancel each other out and the amount of current is zero. A spin current that does not accompany a current is particularly referred to as a pure spin current.

When the flow of electrons of the first spin S1 is represented as $J_\uparrow$, the flow of electrons of the second spin S2 is represented as $J_\downarrow$, and the spin current is represented as $J_S$, it is defined that $J_S=J_\uparrow-J_\downarrow$. The spin current $J_S$ flows in the z direction in the drawing. In FIG. 1, a first ferromagnetic layer 1A to be described later is present on an upper surface of the spin-orbit torque wire 2. Therefore, spins are injected into the first ferromagnetic layer 1A.

The spin-orbit torque wiring 2 is formed of any one of metals, alloys, intermetallic compounds, metal borides, metal carbides, metal silicides, and metal phosphides having a function of generating a spin current due to the spin Hall effect when a current flows.

The main component of the spin-orbit torque wiring 2 is preferably a non-magnetic heavy metal. Here, heavy metals mean metals having the specific weight of yttrium or higher. The non-magnetic heavy metals are preferably non-magnetic metals of which the atomic number is 39 or higher and which have d or f electrons at the outermost shell. These non-magnetic metals have a large spin-orbit interaction that induces the spin Hall effect.

Electrons generally move in an opposite direction from a current regardless of the orientation of the spin. In contrast, non-magnetic metals having a large atomic number and having d or f electrons at the outermost shell have a large spin-orbit interaction and a strong spin Hall effect acts thereupon. Due to this, the moving direction of electrons depends on the orientation of the spin of the electrons. Therefore, a spin current $J_S$ is easily generated in these non-magnetic heavy metals.

The spin-orbit torque wiring 2 may contain magnetic metals. Magnetic metals mean ferromagnetic metals or antiferromagnetic metals. When a very small amount of magnetic metal is contained in non-magnetic metals, the magnetic metal may scatter the spin. When the spin scatters, the spin-orbit interaction is enhanced and the generation efficiency of a spin current with respect to a current increases. A main component of the spin-orbit torque wiring 2 may be antiferromagnetic metal only.

On the other hand, if the amount of added magnetic metal is too large, the generated spin current is scattered by the added magnetic metal and the effect that the spin current decreases strengthens. Due to this, a molar ratio of the added magnetic metal is preferably sufficiently lower than a total molar ratio of elements that form the spin-orbit torque wiring. The molar ratio of the added magnetic metal is preferably 3% or lower with respect to the total amount of constituent elements.

The spin-orbit torque wiring 2 may contain a topological insulator. The topological insulator is a substance of which the inner part is formed of an insulator or a high-resistance member and of which the surface is in a spin-polarized metallic state. An internal magnetic field is formed in this substance due to the spin-orbit interaction. Therefore, a new topological phase is obtained due to the spin-orbit interaction even when there is no external magnetic field. This substance is a topological insulator, and it is possible to generate a pure spin current with high efficiency due to a strong spin-orbit interaction and destruction of reversal symmetry at an edge.

Preferable examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. These topological insulators can generate a spin current with high efficiency.

[Functional Portion]

The functional portion 1 includes a first ferromagnetic layer 1A, a second ferromagnetic layer 1B, and a non-magnetic layer 1C sandwiched between the ferromagnetic layers 1A and 1B. The functional portion 1 is stacked in a second direction (the z direction) crossing the spin-orbit torque wiring 2.

The functional portion 1 is configured such that a resistance thereof changes when a relative angle between a magnetization $M_{1A}$ of the first ferromagnetic layer 1A and a magnetization $M_{1B}$ of the second ferromagnetic layer 1B changes. The magnetization $M_{1B}$ of the second ferromagnetic layer 1B is fixed to one direction (the z direction), and the direction of the magnetization $M_{1A}$ of the first ferromagnetic layer 1A changes in relation to the magnetization $M_{1B}$. The second ferromagnetic layer 1B may sometimes be referred to as a fixed layer, a reference layer, or the like, and the first ferromagnetic layer 1A is sometimes expressed as a free layer, a recording layer, or the like. In application to coercive force difference-type (pseudo spin valve-type) MRAMs, the coercive force of the second ferromagnetic layer 1B is larger than the coercive force of the first ferromagnetic layer 1A. In application to exchange bias-type (spin valve-type) MRAMs, the magnetization $M_{1B}$ of the second ferromagnetic layer 1B is fixed by exchange coupling with an antiferromagnetic layer.

The functional portion 1 has a configuration similar to a tunneling magnetoresistance (TMR) effect element when the non-magnetic layer 1C is formed of an insulator and has a configuration similar to a giant magnetoresistance (GMR) effect element when the non-magnetic layer 1C is formed of metal.

A stacking structure of the functional portion 1 may employ a stacking structure of an existing magnetoresistance effect element. For example, each layer may be made up of a plurality of layers and may include another layer such as an antiferromagnetic layer for fixing the magnetization direction of the second ferromagnetic layer 1B. The second ferromagnetic layer 1B is referred to as a fixing layer or a reference layer and the first ferromagnetic layer 1A is referred to as a free layer, a storage layer, or the like.

The first and second ferromagnetic layers 1A and 1B may be a perpendicular magnetization film in which the easy axis of magnetization of the magnetizations $M_{1A}$ and $M_{1B}$ is oriented in the z direction and may be an in-plane magnetization film in which the easy axis of magnetization is oriented in an xy in-plane direction.

A ferromagnetic material may be used for the first and second ferromagnetic layers 1A and 1B. For example, a metal selected from the group consisting of Cr, Mn, Co, Fe, and Ni, an alloy containing one or more of these metals, an alloy containing these metals and at least one or more elements from B, C, and N, and the like can be used. Specifically, Co—Fe, Co—Fe—B, and Ni—Fe can be used. When the first ferromagnetic layer 1A is an in-plane magnetization film, it is preferable to use Co—Ho alloys ($CoHo_2$), Sm—Fe alloys ($SmFe_{12}$), and the like, for example.

When a Heusler alloy such as $Co_2FeSi$ is used in at least one of the first and second ferromagnetic layers 1A and 1B, a stronger magnetoresistance is obtained. A Heusler alloy contains intermetallic compounds having a chemical composition of $X_2YZ$, where X is a transition metal element or a noble metal element from the Co, Fe, Ni, or Cu groups of the periodic table, Y is transition metal from the Mn, V, Cr, or Ti groups or the types of element for X, and Z is a typical element of Groups III to V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be used.

A layer formed of a ferromagnetic material such as IrMn or PtMn may be stacked on the second ferromagnetic layer 1B. When a synthetic ferromagnetic coupling structure is employed, it is possible to alleviate the influence on the first ferromagnetic layer 1A, of the leakage magnetic field of the second ferromagnetic layer 1B.

Known materials can be used in the non-magnetic layer 1C. For example, when the non-magnetic layer 1C is formed of an insulator (when the layer is a tunneling barrier layer), $Al_2O_3$, $SiO_2$, MgO, $MgAl_2O_4$, and the like can be used as a material thereof. Besides these materials, materials in which some of Al, Si, and Mg are replaced with Zn, Be, or the like can be also used. Among these materials, since MgO and $MgAl_2O_4$ are materials that can realize coherent tunneling, it is possible to inject spins efficiently. When the non-magnetic layer 1C is formed of metal, Cu, Au, Ag, and the like can be used as a material thereof. Furthermore, when the non-magnetic layer 1C is formed of semiconductor, Si, Ge, $CuInSe_2$, $CuGaSe_2$, $Cu(In,Ga)Se_2$, and the like can be used as a material thereof.

The functional portion 1 may have other layers. The functional portion 1 may have a base layer on a surface on the side opposite to the non-magnetic layer 1C of the first ferromagnetic layer 1A. A layer arranged between the spin-orbit torque wiring 2 and the first ferromagnetic layer 1A preferably does not scatter the spins propagating from the spin-orbit torque wiring 2. For example, silver, copper, magnesium, aluminum, and the like are known to have a long spin diffusion length of 100 nm or more and rarely scatter the spins. The thickness of this layer is preferably equal to or smaller than a spin diffusion length of a substance that constitutes the layer. When the thickness of the layer is equal to or smaller than the spin diffusion length, it is possible to transfer the spins propagating from the spin-orbit torque wiring 2 sufficiently to the first ferromagnetic layer 1A.

<Voltage Source>

The voltage source 20 is connected to the spin-orbit torque wiring 2 to apply a voltage in the x direction of the spin-orbit torque wiring 2. The voltage source 20 may be connected directly to the spin-orbit torque wiring 2 and may be connected indirectly as long as it is possible to apply a voltage in the x direction of the spin-orbit torque wiring 2.

The voltage source 20 applies a voltage that is equal to or higher than a critical writing voltage at an environmental temperature and is equal to or lower than a predetermined value in the x direction of the spin-orbit torque wiring 2 during data writing. Here, the environmental temperature is the temperature of the spin-orbit torque-type magnetoresistance effect element 10 and more specifically is the temperature of the spin-orbit torque wiring 2.

The critical writing voltage $V_0$ is calculated by the following relational expression.

[Math. 1]

$$P_1 = \exp\left[-\frac{t_p}{t_0}\exp\left\{-\Delta_{P(AP)}\left(1 - \frac{1}{V_0}\right)\right\}\right] \quad (1)$$

When the critical writing voltage $V_0$ is applied to the spin-orbit torque wiring 2, a write error rate (a probability that, when the magnetization $M_{1A}$ of the first ferromagnetic layer 1A of the functional portion 1 is reversed, the magnetization $M_{1A}$ is not oriented in a desired direction and a writing error occurs) occurring in the functional portion 1 is in a range of $10^{-3}$ to $10^{-4}$. In the present specification, the write error rate when the critical writing voltage is applied is $10^{-3}$. Since the magnetic anisotropy of the first ferromagnetic layer 1A is different depending on a temperature and the resistance of the spin-orbit torque wiring 2 is different depending on a temperature, the critical writing voltage is different depending on an environmental temperature.

Although the critical writing voltage at the environmental temperature, which is a lower limit that the voltage source 20 can apply may be measured at respective temperatures, an estimated value of the critical writing voltage at another temperature region may be calculated from the critical writing voltages at −40° C., 20° C., and 100° C.

First, the critical writing voltages at −40° C., 20° C., and 100° C. are calculated. The respective critical writing voltages are plotted on a graph with temperature on the horizontal axis and voltage on the vertical axis. The plotted critical writing voltage at −40° C. and the plotted critical writing voltage at 20° C. are connected by a straight line. Similarly, the plotted critical writing voltage at 20° C. and the plotted critical writing voltage at 100° C. are connected by a straight line. The voltages positioned on these straight lines can be used as the critical writing voltages estimated at respective temperatures. That is, the estimated critical writing voltage is a voltage positioned on a straight line connecting the critical writing voltage at −40° C. and the critical writing voltage at 20° C. in a temperature region of higher than −40° C. and lower than 20° C., and is a voltage positioned on a straight line connecting the critical writing voltage at 20° C. and the critical writing voltage at 100° C. in a temperature region of higher than 20° C. and lower than 100° C.

A predetermined value which is an upper limit that the voltage source 20 can apply satisfies the following relation.

When the environmental temperature is −40° C., 20° C., and 100° C., the predetermined value is a limit writing voltage at which a write error rate when the magnetization $M_{1A}$ of the first ferromagnetic layer 1A is reversed is equal to the write error rate ($10^{-3}$) when the critical writing voltage $V_0$ is applied.

When the environmental temperature is in the temperature region of lower than 20° C., the predetermined value is a voltage positioned on a straight line connecting the limit writing voltage at −40° C. and the limit writing voltage at 20° C.

When the environmental temperature is in the temperature region of 20° C. or higher, the predetermined value is a voltage positioned on a straight line connecting the limit writing voltage at 20° C. and the limit writing voltage at 100° C.

In the magnetic memory 100 that writes data using an SOT, in principle, there is no upper limit in the voltage applied in the x direction of the spin-orbit torque wiring 2. When a large voltage is applied, it is possible to pass a large writing current through the spin-orbit torque wiring 2, and in principle, it is possible to further decrease the write error rate of a magnetoresistance effect element.

However, when the voltage actually applied in the x direction of the spin-orbit torque wiring 2 varies, it is not possible to record data stably if a voltage of a predetermined value or higher is applied. That is, it can be understood that there is an upper limit (a limit writing voltage) in a voltage able to be applied.

Figure 2:
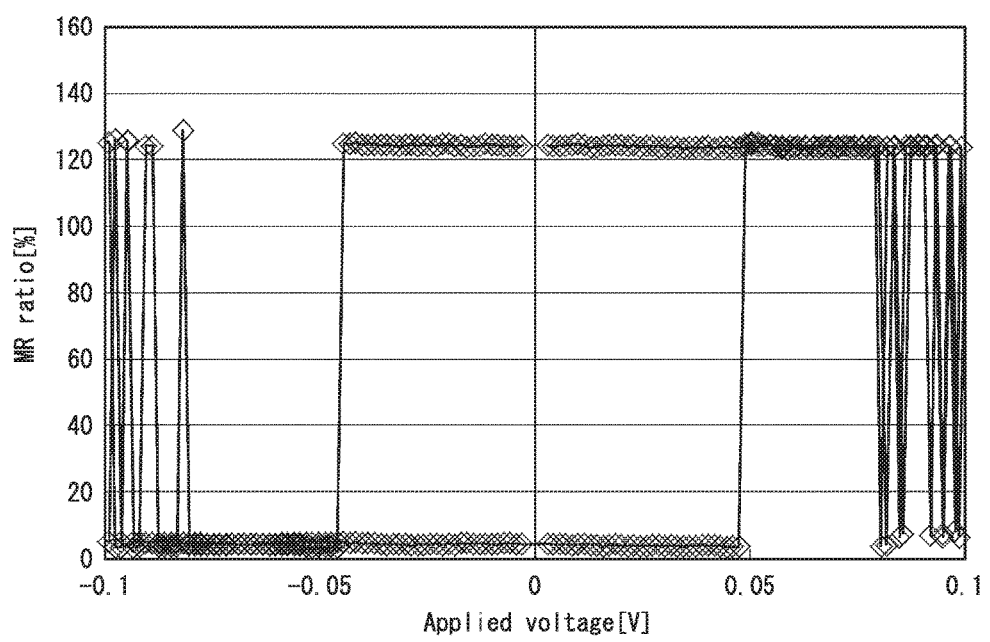
FIG. 2 is a diagram illustrating change in an MR ratio of a functional portion when a writing voltage applied in an x direction of a spin-orbit torque wiring is changed.

FIG. 2 is a diagram illustrating change in a MR ratio of the functional portion (the magnetoresistance effect element) 1 when the writing voltage applied in the x direction of the spin-orbit torque wiring 2 is changed. Here, the MR ratio is (R−Rp)/Rp, where R is a measured resistance, and Rp is a theoretical resistance when the magnetization $M_{1A}$ of the first ferromagnetic layer 1A and the magnetization $M_{1B}$ of the second ferromagnetic layer 1B are in a complete equilibrium state.

As illustrated in FIG. 2, the MR ratio increases abruptly when the voltage applied in the x direction of the spin-orbit torque wiring 2 is increased near 0.05 V. This change means that the magnetization $M_{1A}$ of the first ferromagnetic layer 1A and the magnetization $M_{1B}$ of the second ferromagnetic layer 1B have transitioned from the equilibrium state to an anti-equilibrium state. That is, this means that data is written when a voltage of a predetermined value or higher is applied.

In contrast, when the voltage applied in the x direction of the spin-orbit torque wiring 2 is increased near 0.08 V, the MR ratio starts vibrating between a high ratio state and a low ratio state. Even if a writing voltage is applied so that the magnetization $M_{1A}$ of the first ferromagnetic layer 1A and the magnetization $M_{1B}$ of the second ferromagnetic layer 1B are brought into the anti-equilibrium state, the state does not stabilize between the equilibrium state and the anti-equilibrium state. That is, it is not possible to record data stably when a voltage of a predetermined value or higher is applied.

In other words, as illustrated in FIG. 2, when a voltage of a predetermined value or lower is applied in the x direction of the spin-orbit torque wiring 2, it is possible to write data stably in the magnetic memory 100.

The predetermined value which is an upper limit that the voltage source 20 can apply is preferably a voltage that is equal to or higher than the critical writing voltage at the environmental temperature and is 1.65 or lower times the critical writing voltage at 20° C. when the environmental temperature is 20° C. or higher and is preferably a voltage that is equal to or higher than the critical writing voltage at the environmental temperature and is 1.54 or lower times the critical writing voltage at 20° C. when the environmental temperature is lower than 20° C.

When the spin-orbit torque wiring 2 is tungsten, it is preferable that the predetermined value V satisfies $V=(2.0\times 10^{-3}\times t+1.62)\times V_0$ when the environmental temperature is in the temperature region of lower than 20° C. and satisfies $V=(1.3\times 10^{-3}\times t+1.635)\times V_0$ when the environmental temperature is in the temperature region of 20° C. or higher.

When the spin-orbit torque wiring 2 is tantalum, it is preferable that the predetermined value V satisfies $V=(0.8\times 10^{-3}\times t+1.63)\times V_0$ when the environmental temperature is in the temperature region of lower than 20° C. and satisfies $V=1.63\times V_0$ when the environmental temperature is in the temperature region of 20° C. or higher.

When the spin-orbit torque wiring 2 is iridium, it is preferable that the predetermined value V satisfies $V=(0.2\times 10^{-3}\times t+1.7167)\times V_0$ when the environmental temperature is in the temperature region of lower than 20° C. and satisfies $V=(1.9\times 10^{-3}\times t+1.6825)\times V_0$ when the environmental temperature is in the temperature region of 20° C. or higher.

When the spin-orbit torque wiring 2 is platinum, it is preferable that the predetermined value V satisfies $V=(0.8\times 10^{-3}\times t+1.6333)\times V_0$ when the environmental temperature is in the temperature region of lower than 20° C. and satisfies $V=(0.3\times 10^{-3}\times t+1.645)\times V_0$ when the environmental temperature is in the temperature region of 20° C. or higher.

In these relational expressions, $V_0$ is the critical writing voltage at 20° C. and t is the environmental temperature (° C.).

When data is to be written in the temperature region of 20° C. or higher, it is preferable to apply a voltage that is 1.01 or more times the critical writing voltage in the x direction of the spin-orbit torque wiring 2, more preferably to apply a voltage that is 1.08 or more times the critical writing voltage, and further preferably to apply a voltage that is 1.15 or more times the critical writing voltage. When data is to be written in the temperature region of lower than 20° C., it is preferable to apply a voltage that is 1.05 or more times the critical writing voltage in the x direction of the spin-orbit torque wiring 2. It is preferable that the voltage source 20 can apply these voltages.

If a voltage exceeding the critical writing voltage can be applied in the x direction of the spin-orbit torque wiring 2, although a magnetization reversal of the first ferromagnetic layer 1A occurs, it cannot be said that the write error rate is sufficiently low. When voltages equal to or higher than the above-mentioned values are applied in the respective temperature regions, it is possible to reverse the magnetization of the first ferromagnetic layer 1A more stably. That is, more stable data writing can be realized. When voltages equal to or higher than the above-mentioned values are applied, the write error rate of the magnetic memory 100 can be suppressed to $10^{-7}$ or lower.

When the spin-orbit torque wiring 2 is tungsten, it is preferable to apply a voltage equal to or higher than the following lower-limit voltage $V_{min}$. The lower-limit voltage $V_{min}$ preferably satisfies $V_{min}(1.2\times 10^{-3}\times t+0.9967)\times V_0$ when the environmental temperature is in the temperature region of lower than 20° C. and satisfies $V_{min}=(9.3\times 10^{-3}\times t+0.835)\times V_0$ when the environmental temperature is in the temperature region of 20° C. or higher.

When the spin-orbit torque wiring 2 is tantalum, it is preferable to apply a voltage equal to or higher than the following lower-limit voltage $V_{min}$. The lower-limit voltage $V_{min}$ preferably satisfies $V_{min}=(0.5\times 10^{-3}\times t+1.01)\times V_0$ when the environmental temperature is in the temperature region of lower than 20° C. and satisfies $V_{min}=(0.8\times 10^{-3}\times t+1.005)\times V_0$ when the environmental temperature is in the temperature region of 20° C. or higher.

When the spin-orbit torque wiring 2 is iridium, it is preferable to apply a voltage equal to or higher than the following lower-limit voltage $V_{min}$. The lower-limit voltage $V_{min}$ preferably satisfies $V_{min}=(0.2\times 10^{-3}\times t+1.0567)\times V_0$ when the environmental temperature is in the temperature region of lower than 20° C. and satisfies $V_{min}=(1.1\times 10^{-3}\times t+1.0375)\times V_0$ when the environmental temperature is in the temperature region of 20° C. or higher.

When the spin-orbit torque wiring 2 is platinum, it is preferable to apply a voltage equal to or higher than the following lower-limit voltage $V_{min}$. The lower-limit voltage $V_{min}$ preferably satisfies $V_{min}=(0.3\times 10^{-3}\times t+1.0033)\times V_0$ when the environmental temperature is in the temperature region of lower than 20° C. and satisfies $V_{min}=(0.2\times 10^{-3}\times t+1.005)\times V_0$ when the environmental temperature is in the temperature region of 20° C. or higher.

In these relational expressions, $V_0$ is the critical writing voltage at 20° C. and t is the environmental temperature (° C.).

The voltage applied in the x direction of the spin-orbit torque wiring 2 is preferably 1.2 times or more and 1.54 or lower times the critical writing voltage. The environmental temperature to which the magnetic memory 100 is exposed changes according to a use state of users. Due to this, it is sometimes necessary to guarantee data in a wide temperature region of −40° C. or higher and 100° C. or lower. When a voltage that is 1.2 times or more and 1.54 or lower times the critical writing voltage is applied in the x direction of the spin-orbit torque wiring 2, it is possible to write data stably in a wide temperature region of −40° C. or higher and 100° C. or lower.

<Thermometer>

Figure 3:
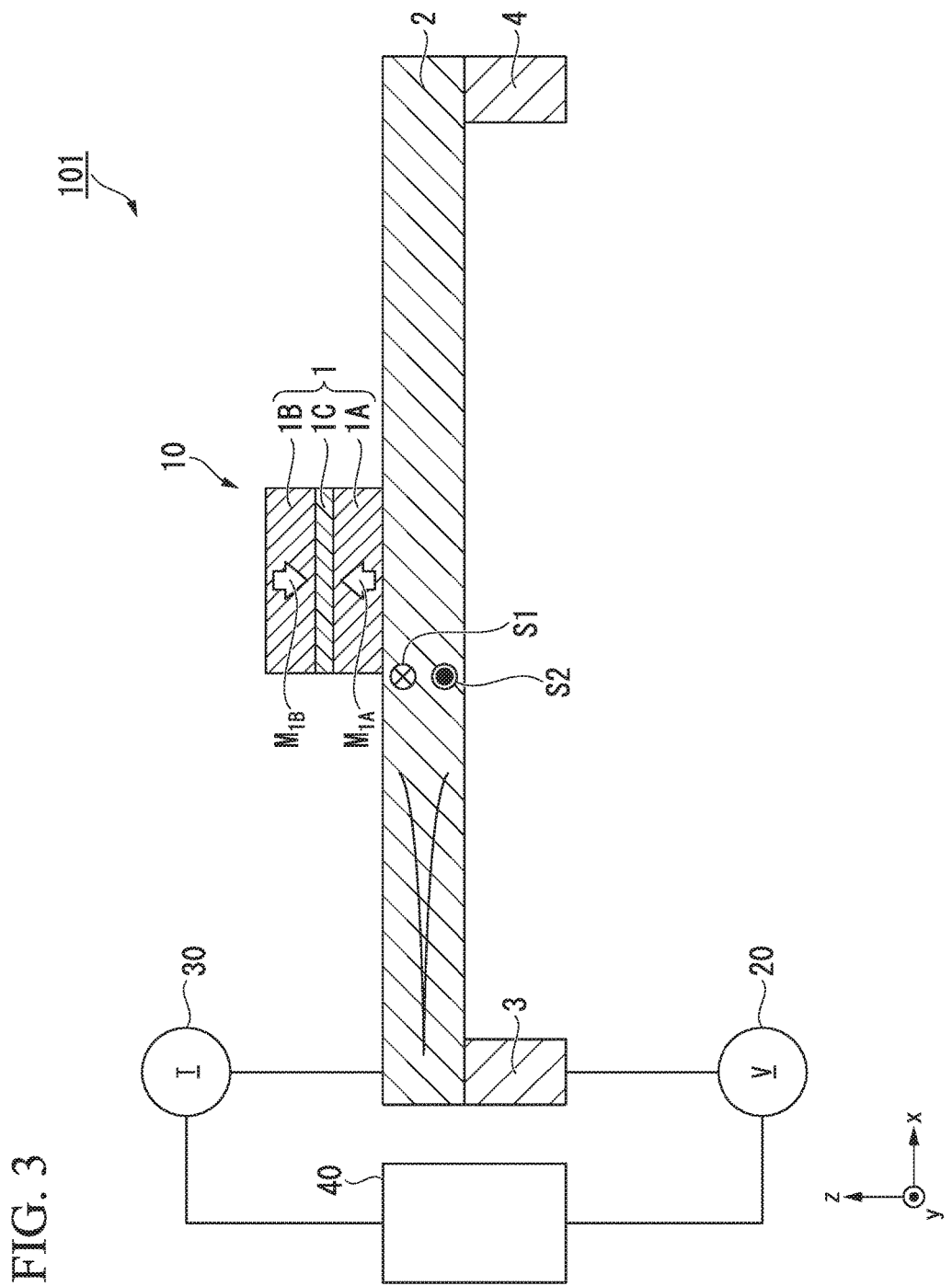
FIG. 3 is a schematic diagram of another example of the magnetic memory according to the present embodiment.

FIG. 3 is a sectional schematic diagram of another example of the magnetic memory according to the present embodiment. As illustrated in FIG. 3, a magnetic memory 101 may include a thermometer 30. The thermometer 30 calculates the temperature of the spin-orbit torque wiring 2 from the resistance of the spin-orbit torque wiring 2. The calculated temperature is delivered to a voltage controller 40. The voltage controller 40 determines a voltage that the voltage source 20 applies to the spin-orbit torque wiring 2 on the basis of the temperature.

When the temperature when using the magnetic memory is measured by the thermometer 30, it is not necessary to limit the range of writing voltages to a range in which control is possible in an entire environmental temperature range where the magnetic memory is used. The writing voltage can thus be determined according to the environmental temperature during use, and optimum data writing can be performed.

A number of thermometers 30 may be provided without there being limitation to one thermometer. For example, the thermometers 30 may be provided at positions corresponding to four corners when the spin-orbit torque wiring 2 is seen from the z direction.

Although FIGS. 1 and 3 illustrate a case in which one spin-orbit torque-type magnetoresistance effect element 10 includes the functional portion 1 and the spin-orbit torque wiring 2 is provided in the magnetic memory 100 or 101, a number of spin-orbit torque-type magnetoresistance effect elements 10 may be provided. In order to increase the degree of integration of the magnetic memory 100 or 101, it is preferable to decrease the distance between adjacent spin-orbit torque-type magnetoresistance effect elements 10 as much as possible. Due to this, heating of adjacent spin-orbit torque-type magnetoresistance effect elements 10 may affect a writing voltage. In this case, by measuring an accurate temperature of the respective spin-orbit torque wirings 2 using a plurality of thermometers 30, it is possible to perform data writing more optimally.

As described above, according to the magnetic memory of the present embodiment, it is possible to write data stably.

(Data Writing Method)

A data writing method according to the present embodiment controls a writing voltage applied in the x direction of the spin-orbit torque wiring 2 of the spin-orbit torque-type magnetoresistance effect element 10.

The writing voltage is set to be equal to or higher than the critical writing voltage at the environmental temperature and be equal to or lower than a predetermined value. The predetermined value is calculated in the above-described manner.

The writing voltage is preferably equal to or higher than the critical writing voltage at the environmental temperature and is 1.65 or lower times the critical writing voltage at 20° C. when the environmental temperature is in the temperature region of 20° C. or higher and is preferably equal to or higher than the critical writing voltage at the environmental temperature and is 1.54 or lower times the critical writing voltage at 20° C. when the environmental temperature is in the temperature region of lower than 20° C.

Moreover, the writing voltage is preferably 1.01 or more times the critical writing voltage in the temperature region of 20° C. or higher, more preferably, 1.08 or more times the critical writing voltage, and further preferably, 1.15 or more times the critical writing voltage. The writing voltage is preferably 1.05 or more times the critical writing voltage in the temperature region of lower than 20° C. Furthermore, the writing voltage is more preferably 1.2 times or more and 1.54 or lower times the critical writing voltage in the temperature region of −40° C. or higher and 100° C. or lower.

When the material of the spin-orbit torque wiring 2 is determined, it is preferable to determine the upper limit and the lower limit to be applied during data writing on the basis of the above-described relational expressions.

The critical writing voltage at the environmental temperature may be measured at the respective temperatures, and an estimated value of the critical writing voltage in another temperature region may be calculated from the critical writing voltages at −40° C., 20° C., and 100° C.

As described above, according to the data writing method of the present embodiment, it is possible to write data stably in the magnetic memory.

While a preferred embodiment of the present invention has been described in detail, the present invention is not limited to a specific embodiment, and various modifications and changes can be made within the scope of the present invention described in the claims.

EXAMPLES

Example 1

The spin-orbit torque-type magnetoresistance effect element 10 illustrated in FIG. 1 was fabricated. A layer of tungsten (W) was laminated to a thickness of 3 nm on a thermally oxidized silicon substrate. The tungsten layer was processed to a width of 50 nm and a length of 300 nm whereby the spin-orbit torque wiring 2 was obtained. The periphery of the spin-orbit torque wiring 2 was coated with an insulating film formed of silicon oxide.

Subsequently, layers of CoFeB (1 nm thick), $MgAl_2O_4$ (3 nm thick), CoFeB (1 nm thick), Ta (0.4 nm thick), [Co (0.4 nm thick)/Pt (0.8 nm thick)]$_4$, Co (0.4 nm thick), Ru (0.4 nm thick), [Co (0.4 nm thick)/Pt (0.8 nm thick)] 5, Co (0.4 nm thick), and Pt (10 nm thick) were formed in that order on the spin-orbit torque wiring 2 and the insulating film. The fabricated layers were annealed at 350° C. and processed into a square shape of 50 nm by 50 nm whereby the functional portion 1 was fabricated. The CoFeB layer stacked first corresponds to the first ferromagnetic layer 1A, the $MgAl_2O_4$ layer corresponds to the non-magnetic layer 1C, and a SAF (synthetic antiferromagnetic) structure corresponds to the second ferromagnetic layer 1B. The first ferromagnetic layer 1A is a perpendicular magnetization film.

The spin-orbit torque-type magnetoresistance effect elements 10 were arranged in a 10×10 array and the respective spin-orbit torque wirings 2 were connected to the voltage source 20 whereby the magnetic memory was obtained. A writing pulse was applied to the spin-orbit torque wiring 2 and a change in the write error rate was evaluated. During writing, a magnetic field of 100 Oe was applied in the x direction. The pulse width of the writing pulse was 10 nsec. One cycle-time was 60 nsec composed of write 10 nsec, standby 10 nsec, read 20 nsec, standby 10 nsec. The write error rate was calculated by measuring the resistances in the low and high-resistance states of each device and counting an event that an intended writing state was not achieved as an error using the average resistances of the high and low-resistance states as the reference data writing resistances of "0" and "1". When reading data, a voltage of 1 mV was applied in the stacking direction of the functional portion 1.

Figure 4A:
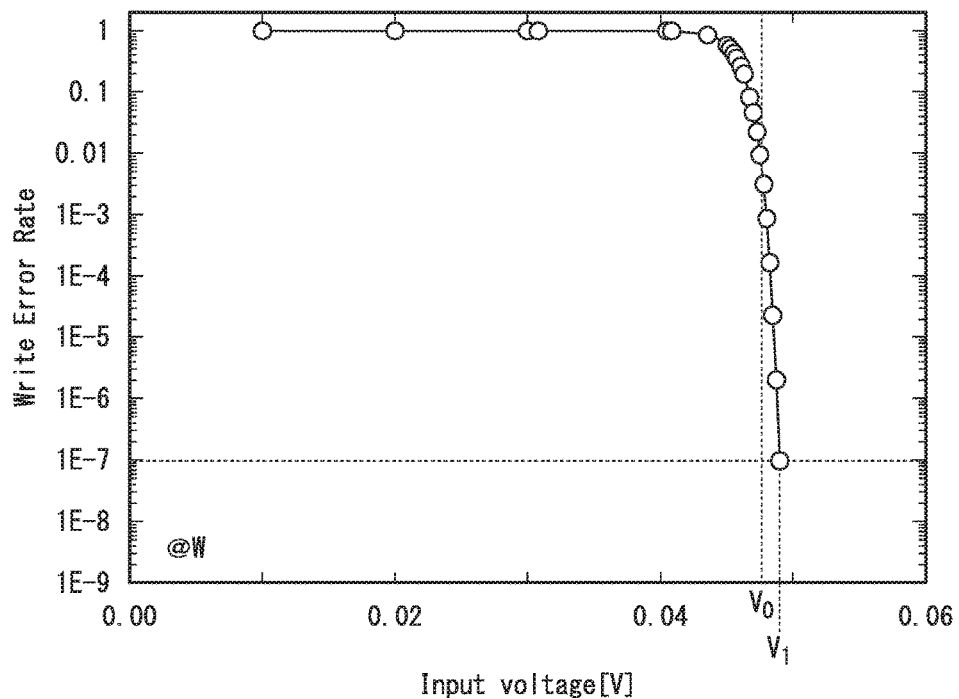
FIG. 4A illustrates change in a write error rate of a magnetic memory of Example 1 when an applied voltage of a writing pulse was changed.

FIG. 4A illustrates a change in a write error rate of the magnetic memory of Example 1 when an applied voltage of a writing pulse was changed. When the applied voltage was low, since writing did not start, an intended writing state was not realized and an error was output. On the other hand, when the applied voltage was increased, writing started and the write error rate decreased. The critical writing voltage $V_0$ was 0.04842, and the write error rate was $10^{-7}$ when 0.04890 V was applied. A voltage at which the write error rate was $10^{-7}$ or lower is the lower-limit voltage $V_1$. The lower-limit voltage $V_1$ was 1.01 times the critical writing voltage $V_0$.

Figure 4B:
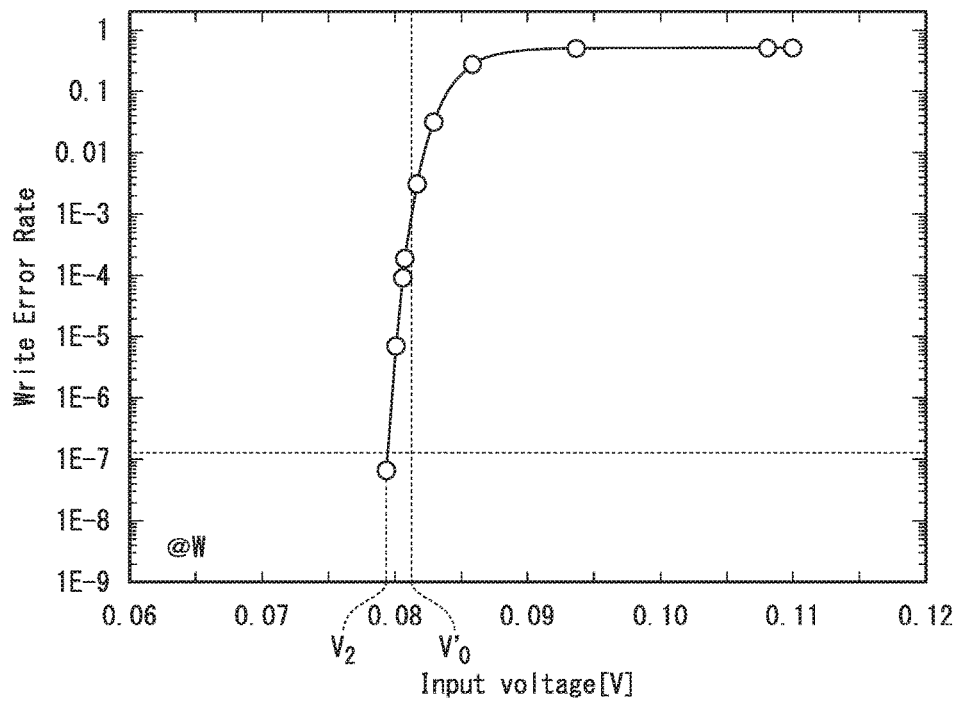
FIG. 4B illustrates change in a write error rate of a magnetic memory of Example 1 when an applied voltage of a writing pulse was changed.

FIG. 4B illustrates a change in a write error rate of the magnetic memory of Example 1 when an applied voltage of a writing pulse was changed. When the applied voltage exceeded a predetermined value, the write error rate increased. When a voltage at which the write error rate was $10^{-7}$ or higher is an upper-limit voltage $V_2$, the upper-limit voltage $V_2$ was 0.08038 V. The upper-limit voltage $V_2$ was 1.66 times the critical writing voltage $V_0$.

The graph illustrated in FIG. 4A can be fitted to the following relational expression (1). In the following relational expression, $P_1$ is a probability that an anti-equilibrium state (data "1") changes to an equilibrium state (data "0") or an equilibrium state (data "0") changes to an anti-equilibrium state (data "1"), $t_p$ is a pulse application time, $t_0$ is a theoretical time necessary for magnetization reversal, $\Delta_{P(AP)}$ is a value indicating thermal stability, and $V_0$ is a critical writing voltage. Here, $\Delta_{P(AP)}$ is calculated by $KV/k_BT$ (K is a uniaxial magnetic anisotropy, V is a volume, $k_B$ is the Boltzmann constant, and T is an absolute temperature).

[Math. 2]

$$P_1 = \exp\left[-\frac{t_p}{t_o}\exp\left\{-\Delta_{P(AP)}\left(1-\frac{1}{V_0}\right)\right\}\right] \quad (1)$$

The graph illustrated in FIG. 4B can be fitted to the following relational expression (2).

In the following relational expression, $P_2$ is a probability that an anti-equilibrium state (data "1") or an equilibrium state (data "0") changes to an unstable state (data "0.5") which is midway between the equilibrium state and the anti-equilibrium state, $t_p$ is a pulse application time, and to is a theoretical time necessary for magnetization reversal and is generally 1 nsec. $\Delta_{P(AP)}$ is a value indicating thermal stability and $V_0'$ is a limit writing voltage. Here, $\Delta_{P(AP)}$ is calculated by $KV/k_B T$ (K is uniaxial magnetic anisotropy, V is a volume, $k_B$ is the Boltzmann constant, and T is an absolute temperature). The limit writing voltage $V_0'$ is a voltage at which the write error rate reaches $10^{-3}$ from a state in which data was written stably.

[Math. 3]

$$P_2 = 0.5 \ \exp\left[-\frac{t_p}{t_o}\exp\left\{\Delta_{P(AP)}\left(1 - \frac{1}{V_0'}\right)\right\}\right] \quad (2)$$

Example 2

Example 2 is different from Example 1 in that the environmental temperature to which the magnetic memory was exposed was set to −40° C. The other conditions were similar to those of Example 1. The resistivity of the spin-orbit torque wiring 2 was 40 μΩcm while it was 53.8 μΩcm at 20° C.

The critical writing voltage $V_0$ at −40° C. of the magnetic memory of Example 2 was 0.04554 V, the lower-limit voltage $V_1$ was 0.04600 V, and the upper-limit voltage $V_2$ was 0.07457 V. That is, the lower-limit voltage $V_1$ was 0.95 times the critical writing voltage $V_0$ at 20° C. and the upper-limit voltage $V_2$ was 1.54 times the critical writing voltage $V_0$ at 20° C.

Example 3

Example 3 is different from Example 1 in that the environmental temperature to which the magnetic memory is exposed is set to 100° C. The other conditions are similar to those of Example 1. The resistivity of the spin-orbit torque wiring 2 was 73 μΩcm while it was 53.8 μΩcm at 20° C.

The critical writing voltage $V_0$ at 100° C. of the magnetic memory of Example 3 was 0.05178 V, the lower-limit voltage $V_1$ was 0.05229 V, and the upper-limit voltage $V_2$ was 0.08522 V. That is, the lower-limit voltage $V_1$ was 1.08 times the critical writing voltage $V_0$ at 20° C. and the upper-limit voltage $V_2$ was 1.76 times the critical writing voltage $V_0$ at 20° C.

Example 4

Example 4 is different from Example 1 in that the environmental temperature to which the magnetic memory is exposed is set to 0° C. The other conditions are similar to those of Example 1. The critical writing voltage $V_0$ at 0° C. was estimated from the results at −40° C. and 20° C. and was 0.04746 V.

The lower-limit voltage $V_1$ of the magnetic memory of Example 4 was 0.04794 V and the upper-limit voltage $V_2$ was 0.07844 V. That is, the lower-limit voltage $V_1$ was 0.99 times the critical writing voltage $V_0$ at 20° C. and the upper-limit voltage $V_2$ was 1.62 times the critical writing voltage $V_0$ at 20° C. This value satisfies the relational expression when the spin-orbit torque wiring 2 is tungsten. It was confirmed that data could be written stably since the upper-limit voltage $V_2$ was within the predetermined range of the estimated critical writing voltage.

Example 5

Example 5 is different from Example 1 in that the environmental temperature to which the magnetic memory is exposed is set to 50° C. The other conditions are similar to those of Example 1. The critical writing voltage $V_0$ at 50° C. was estimated from the results at 20° C. and 100° C. and was 0.04968 V.

The lower-limit voltage $V_1$ of the magnetic memory of Example 5 was 0.05018 V and the upper-limit voltage $V_2$ was 0.08219 V. That is, the lower-limit voltage $V_1$ was 1.04 times the critical writing voltage $V_0$ at 20° C. and the upper-limit voltage $V_2$ was 1.70 times the critical writing voltage $V_0$ at 20° C. This value satisfies the relational expression when the spin-orbit torque wiring 2 is tungsten. It was confirmed that data could be written stably since the upper-limit voltage $V_2$ was within the predetermined range of the estimated critical writing voltage.

Example 6

Example 6 is different from Example 1 in that the material that forms the spin-orbit torque wiring 2 is changed from tungsten (W) to tantalum (Ta). The other conditions are similar to those of Example 1.

Figure 5A:
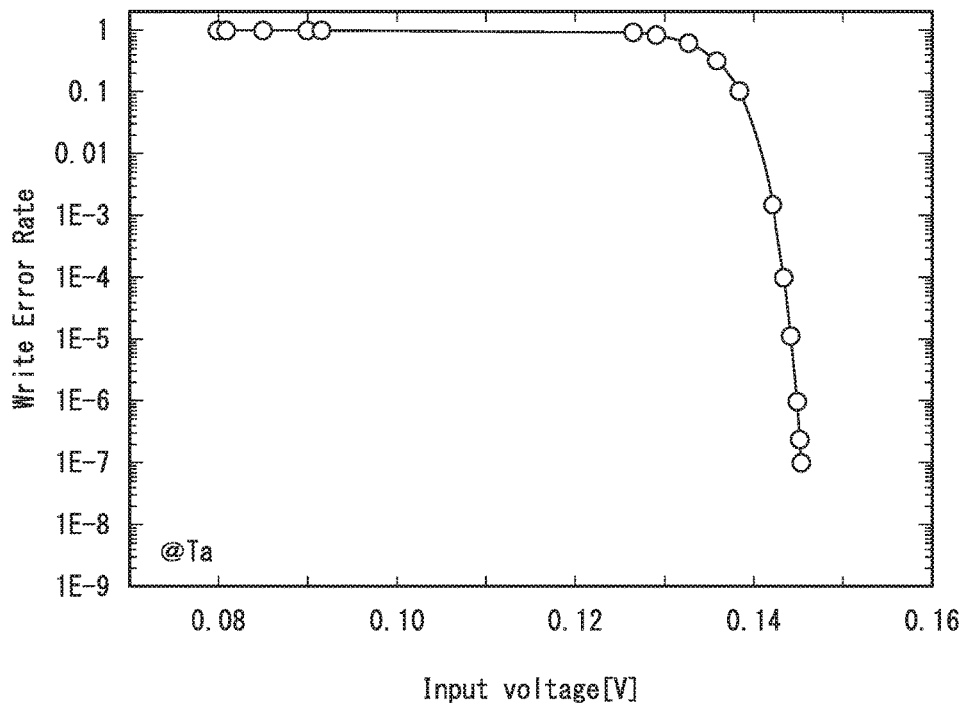
FIG. 5A illustrates change in a write error rate of a magnetic memory of Example 6 when an applied voltage of a writing pulse was changed.
Figure 5B:
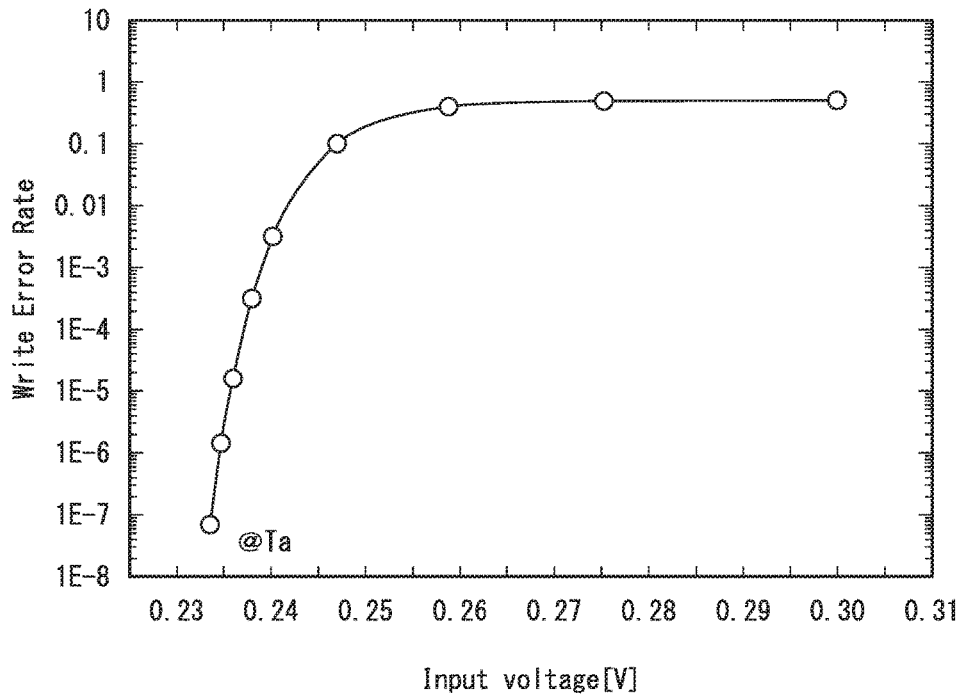
FIG. 5B illustrates change in a write error rate of a magnetic memory of Example 6 when an applied voltage of a writing pulse was changed.

FIGS. 5A and 5B illustrate a change in a write error rate of the magnetic memory of Example 6 when an applied voltage of a writing pulse was changed. The graph illustrated in FIG. 5A can be fitted to the relational expression (1) and the graph illustrated in FIG. 5B can be fitted to the relational expression (2). The critical writing voltage $V_0$ was 0.1423 V and the lower-limit voltage $V_1$ was 0.1438 V. The lower-limit voltage $V_1$ was 1.01 times the critical writing voltage $V_0$. The upper-limit voltage $V_2$ was 0.2349 V. The upper-limit voltage $V_2$ was 1.65 times the critical writing voltage $V_0$.

Example 7

Example 7 is different from Example 6 in that the environmental temperature to which the magnetic memory is exposed is set to −40° C. The other conditions are similar to those of Example 6. The resistivity of the spin-orbit torque wiring 2 was 102 μΩcm while it was 131.8 μΩcm at 20° C.

The critical writing voltage $V_0$ at −40° C. of the magnetic memory of Example 7 was 0.1395 V, the lower-limit voltage $V_1$ was 0.1409 V, and the upper-limit voltage $V_2$ was 0.2278 V. That is, the lower-limit voltage $V_1$ was 0.99 times the critical writing voltage $V_0$ at 20° C. and the upper-limit voltage $V_2$ was 1.60 times the critical writing voltage $V_0$ at 20° C.

Example 8

Example 8 is different from Example 6 in that the environmental temperature to which the magnetic memory is exposed is set to 100° C. The other conditions are similar to those of Example 6. The resistivity of the spin-orbit torque wiring 2 was 167 μΩcm while it was 131.8 μΩcm at 20° C.

The critical writing voltage $V_0$ at 100° C. of the magnetic memory of Example 8 was 0.1423 V, the lower-limit voltage $V_1$ was 0.1438 V, and the upper-limit voltage $V_2$ was 0.2349 V. That is, the lower-limit voltage $V_1$ was 1.01 times the critical writing voltage $V_0$ at 20° C. and the upper-limit voltage $V_2$ was 1.65 times the critical writing voltage $V_0$ at 20° C.

Example 9

Example 9 is different from Example 1 in that the material that forms the spin-orbit torque wiring 2 is changed from tungsten (W) to iridium (Ir). The other conditions are similar to those of Example 1.

Figure 6A:
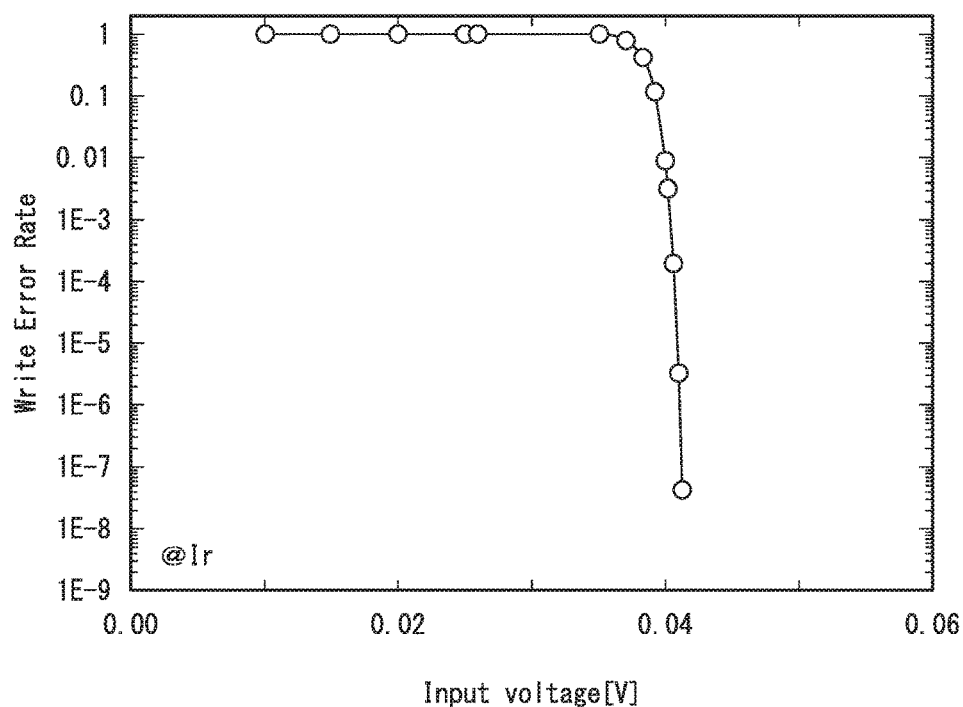
FIG. 6A illustrates change in a write error rate of a magnetic memory of Example 9 when an applied voltage of a writing pulse was changed.
Figure 6B:
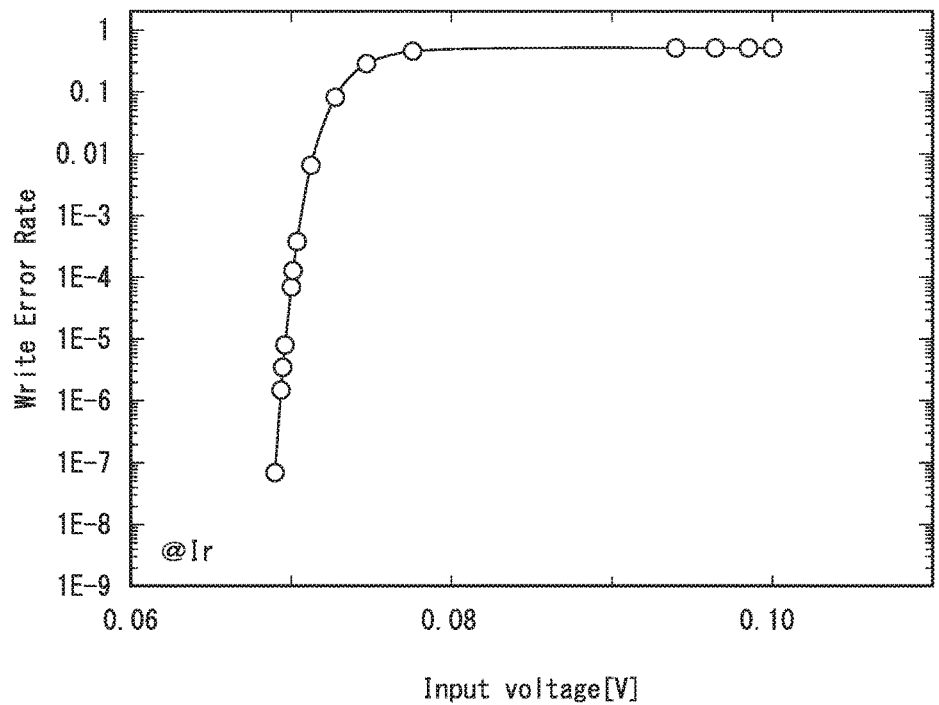
FIG. 6B illustrates change in a write error rate of a magnetic memory of Example 9 when an applied voltage of a writing pulse was changed.

FIGS. 6A and 6B illustrate a change in a write error rate of the magnetic memory of Example 9 when an applied voltage of a writing pulse was changed. The graph illustrated in FIG. 6A can be fitted to the relational expression (1) and the graph illustrated in FIG. 6B can be fitted to the relational expression (2). The critical writing voltage $V_0$ was 0.04036 V and the lower-limit voltage $V_1$ was 0.04076 V. The lower-limit voltage Vi was 1.06 times the critical writing voltage $V_0$. The upper-limit voltage $V_2$ was 0.06982 V. The upper-limit voltage $V_2$ was 1.72 times the critical writing voltage $V_0$.

Example 10

Example 10 is different from Example 9 in that the environmental temperature to which the magnetic memory is exposed is set to −40° C. The other conditions are similar to those of Example 9. The resistivity of the spin-orbit torque wiring 2 was 39 μΩcm while it was 47.2 μΩcm at 20° C.

The critical writing voltage $V_0$ at −40° C. of the magnetic memory of Example 10 was 0.04036 V, the lower-limit voltage $V_1$ was 0.04237 V, and the upper-limit voltage $V_2$ was 0.06901 V. That is, the lower-limit voltage $V_1$ was 1.05 times the critical writing voltage $V_0$ at 20° C. and the upper-limit voltage $V_2$ was 1.71 times the critical writing voltage $V_0$ at 20° C.

Example 11

Example 11 is different from Example 9 in that the environmental temperature to which the magnetic memory is exposed is set to 100° C. The other conditions are similar to those of Example 9. The resistivity of the spin-orbit torque wiring 2 was 68 μΩcm while it was 47.2 μΩcm at 20° C.

The critical writing voltage $V_0$ at 100° C. of the magnetic memory of Example 11 was 0.04595 V, the lower-limit voltage $V_1$ was 0.04641 V, and the upper-limit voltage $V_2$ was 0.07547 V. That is, the lower-limit voltage $V_1$ was 1.15 times the critical writing voltage $V_0$ at 20° C. and the upper-limit voltage $V_2$ was 1.87 times the critical writing voltage $V_0$ at 20° C.

Example 12

Example 12 is different from Example 1 in that the material that forms the spin-orbit torque wiring 2 is changed from tungsten (W) to platinum (Pt). The other conditions are similar to those of Example 1.

Figure 7A:
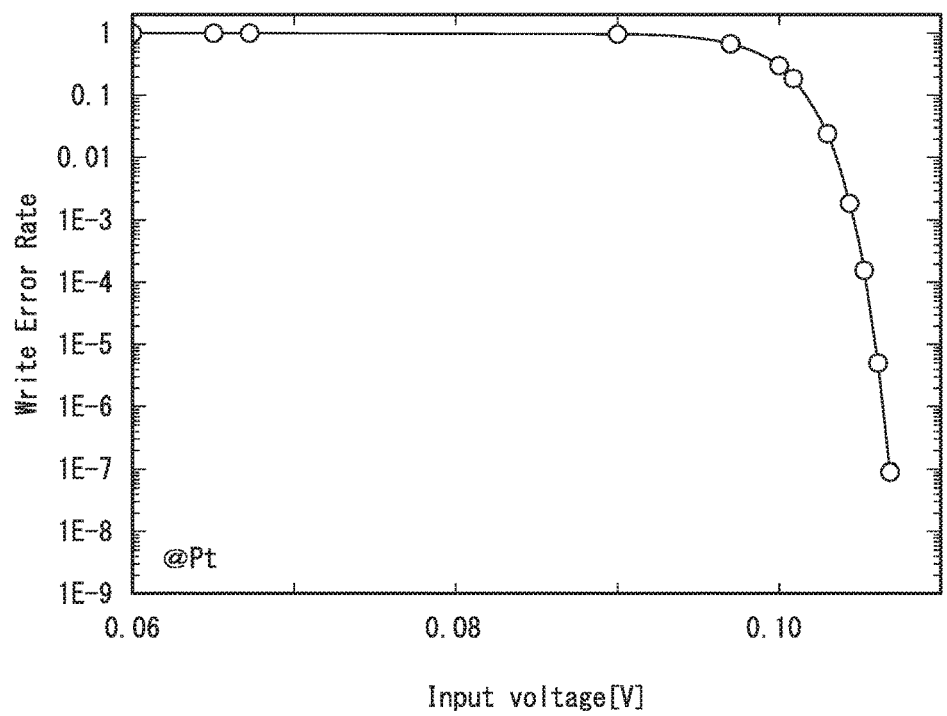
FIG. 7A illustrates change in a write error rate of a magnetic memory of Example 12 when an applied voltage of a writing pulse was changed.
Figure 7B:
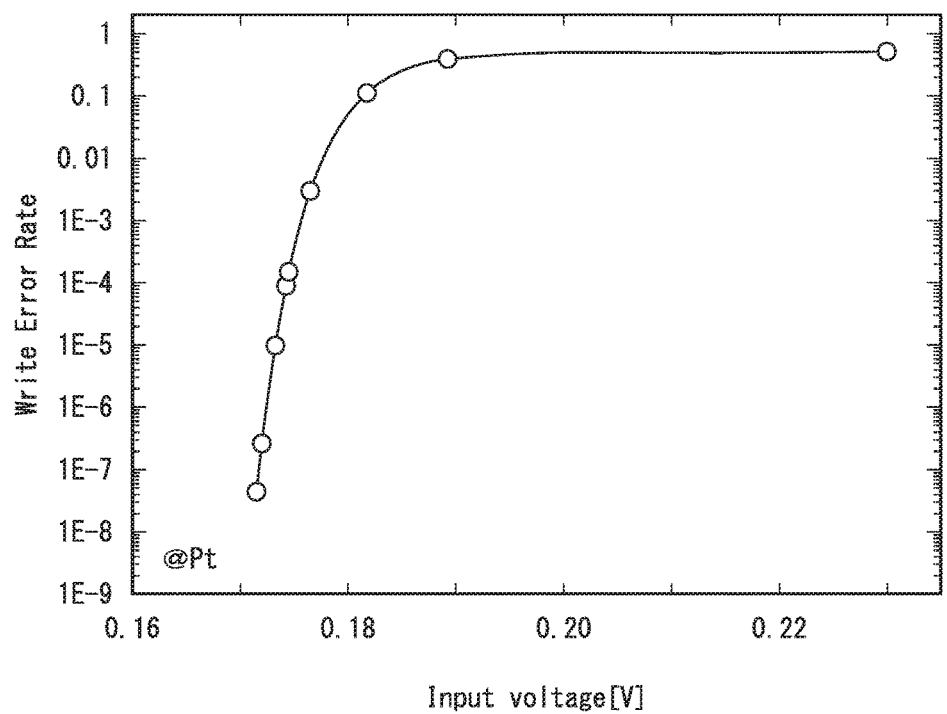
FIG. 7B illustrates change in a write error rate of a magnetic memory of Example 12 when an applied voltage of a writing pulse was changed.

FIGS. 7A and 7B illustrate a change in a write error rate of the magnetic memory of Example 12 when an applied voltage of a writing pulse was changed. The graph illustrated in FIG. 7A can be fitted to the relational expression (1) and the graph illustrated in FIG. 7B can be fitted to the relational expression (2). The critical writing voltage $V_0$ was 0.1046 V and the lower-limit voltage $V_1$ was 0.1057 V. The lower-limit voltage $V_1$ was 1.01 times the critical writing voltage $V_0$. The upper-limit voltage $V_2$ was 0.1726 V. The upper-limit voltage $V_2$ was 1.65 times the critical writing voltage $V_0$.

Example 13

Example 13 is different from Example 12 in that the environmental temperature to which the magnetic memory is exposed is set to −40° C. The other conditions are similar to those of Example 13. The resistivity of the spin-orbit torque wiring 2 was 82 μΩcm while it was 105.7 μΩcm at 20° C.

The critical writing voltage $V_0$ at −40° C. of the magnetic memory of Example 13 was 0.1025 V, the lower-limit voltage $V_1$ was 0.1036 V, and the upper-limit voltage $V_2$ was 0.1674 V. That is, the lower-limit voltage $V_1$ was 1.0 times the critical writing voltage $V_0$ at 20° C. and the upper-limit voltage $V_2$ was 1.60 times the critical writing voltage $V_0$ at 20° C.

Example 14

Example 14 is different from Example 12 in that the environmental temperature to which the magnetic memory is exposed is set to 100° C. The other conditions are similar to those of Example 12. The resistivity of the spin-orbit torque wiring 2 was 136.0 μΩcm while it was 105.7 μΩcm at 20° C.

The critical writing voltage $V_0$ at 100° C. of the magnetic memory of Example 14 was 0.1067 V, the lower-limit voltage $V_1$ was 0.1078 V, and the upper-limit voltage $V_2$ was 0.1747 V. That is, the lower-limit voltage $V_1$ was 1.03 times the critical writing voltage $V_0$ at 20° C. and the upper-limit voltage $V_2$ was 1.67 times the critical writing voltage $V_0$ at 20° C.

The results of changes in temperature when the respective materials were used can be fitted using the relational expressions (1) and (2).

REFERENCE SIGNS LIST

1 Functional Portion
1A First Ferromagnetic Layer
1B Second Ferromagnetic Layer
1C Non-Magnetic Layer
2 Spin-Orbit Torque Wiring
3 First Electrode
4 Second Electrode
10 Spin-Orbit Torque-Type Magnetoresistance effect element
20 Voltage Source
30 Thermometer
40 Voltage Controller
100, 101 Magnetic Memory

What is claimed is:
1. A data writing method in a spin-orbit torque-type magnetoresistance effect element comprising:
a spin-orbit torque wiring extending in a first direction; and
a functional portion having a first ferromagnetic layer, a non-magnetic layer, and a second ferromagnetic layer stacked on one surface of the spin-orbit torque wiring in that order from the spin-orbit torque wiring, wherein
a voltage applied in the first direction of the spin-orbit torque wiring is equal to or higher than a critical writing voltage at an environmental temperature and is equal to or lower than a predetermined value, and the predetermined value is set such that:

when the environmental temperature is −40° C., 20° C., and 100° C., the predetermined value is a limit writing voltage at which a write error rate when magnetization of the first ferromagnetic layer is reversed is equal to a write error rate when the critical writing voltage is applied;

when the environmental temperature is in a temperature region of lower than 20° C., the predetermined value is a voltage positioned on a straight line connecting a limit writing voltage at −40° C. and a limit writing voltage at 20° C.; and when the environmental temperature is in a temperature region of 20° C. or higher, the predetermined value is a voltage positioned on a straight line connecting a limit writing voltage at 20° C. and a limit writing voltage at 100° C.

2. The data writing method according to claim 1, wherein when the environmental temperature is in the temperature region of 20° C. or higher, a voltage that is 1.01 or more times the critical writing voltage at 20° C. is applied in the first direction of the spin-orbit torque wiring during data writing, and when the environmental temperature is in the temperature region of lower than 20° C., a voltage that is 1.05 or more times the critical writing voltage at 20° C. is applied in the first direction of the spin-orbit torque wiring during data writing.

3. The data writing method according to claim 1, wherein when the environmental temperature is 20° C. or higher, a voltage that is equal to or higher than the critical writing voltage at the environmental temperature and is 1.65 or lower times the critical writing voltage at 20° C. is applied in the first direction of the spin-orbit torque wiring during data writing, and when the environmental temperature is lower than 20° C., a voltage that is equal to or higher than the critical writing voltage at the environmental temperature and is 1.54 or lower times the critical writing voltage at 20° C. is applied in the first direction of the spin-orbit torque wiring during data writing.

4. The data writing method according to claim 1, wherein when data is written in a temperature region of −40° C. or higher and 100° C. or lower, a voltage that is 1.2 times or more and 1.54 or lower times the critical writing voltage is applied in the first direction of the spin-orbit torque wiring.

5. The data writing method according to claim 1, wherein the spin-orbit torque wiring is tungsten, if the critical writing voltage at 20° C. is $V_0$ and the environmental temperature is t (° C.), when the environmental temperature is in the temperature region of lower than 20° C., the predetermined value V satisfies:

$V=(2.0\times10^{-3}\times t+1.62)\times V_0$, and when the environmental temperature is in the temperature region of 20° C. or higher, the predetermined value satisfies:

$V=(1.3\times10^{-3}\times t+1.635)\times V_0$.

6. The data writing method according to claim 1, wherein the spin-orbit torque wiring is tantalum, if the critical writing voltage at 20° C. is $V_0$ and the environmental temperature is t (° C.), when the environmental temperature is in the temperature region of lower than 20° C., the predetermined value V satisfies:

$V=(0.8\times10^{-3}\times t+1.63)\times V_0$, and when the environmental temperature is in the temperature region of 20° C. or higher, the predetermined value satisfies:

$V=1.65\times V_0$.

7. The data writing method according to claim 1, wherein the spin-orbit torque wiring is iridium, if the critical writing voltage at 20° C. is $V_0$ and the environmental temperature is t (° C.), when the environmental temperature is in the temperature region of lower than 20° C., the predetermined value V satisfies:

$V=(0.2\times10^{-3}\times t+1.7167)\times V_0$, and when the environmental temperature is in the temperature region of 20° C. or higher, the predetermined value satisfies:

$V=(1.9\times10^{-3}\times t+1.6825)\times V_0$.

8. The data writing method according to claim 1, wherein the spin-orbit torque wiring is platinum, if the critical writing voltage at 20° C. is $V_0$ and the environmental temperature is t (° C.), when the environmental temperature is in the temperature region of lower than 20° C., the predetermined value V satisfies:

$V=(0.8\times10^{-3}\times t+1.6333)\times V_0$, and when the environmental temperature is in the temperature region of 20° C. or higher, the predetermined value satisfies:

$V=(0.3\times10^{-3}\times t+1.645)\times V_0$.

9. A magnetic memory comprising: a spin-orbit torque wiring extending in a first direction;

a functional portion having a first ferromagnetic layer, a non-magnetic layer, and a second ferromagnetic layer stacked on one surface of the spin-orbit torque wiring in that order from the spin-orbit torque wiring; and a voltage source that is connected to the spin-orbit torque wiring and applies a voltage that is equal to or higher than a critical writing voltage at an environmental temperature and is equal to or lower than a predetermined value in the first direction, wherein the predetermined value is set such that:

when the environmental temperature is −40° C., 20° C., and 100° C., the predetermined value is a limit writing voltage at which a write error rate when magnetization of the first ferromagnetic layer is reversed is equal to a write error rate when the critical writing voltage is applied;

when the environmental temperature is in a temperature region of lower than 20° C., the predetermined value is a voltage positioned on a straight line connecting a limit writing voltage at −40° C. and a limit writing voltage at 20° C.; and when the environmental temperature is in a temperature region of 20° C. or higher, the predetermined value is a voltage positioned on a straight line connecting a limit writing voltage at 20° C. and a limit writing voltage at 100° C.

10. The magnetic memory according to claim 9, further comprising: a thermometer that is connected to the spin-orbit torque wire to convert a resistance of the spin-orbit torque wire to a temperature of the spin-orbit torque wire.

11. The data writing method according to claim 2, wherein when the environmental temperature is 20° C. or higher, a voltage that is equal to or higher than the critical writing voltage at the environmental temperature and is 1.65 or lower times the critical writing voltage at 20° C. is applied in the first direction of the spin-orbit torque wiring during data writing, and when the environmental temperature is lower than 20° C., a voltage that is equal to or higher than the critical writing voltage at the environmental temperature and is 1.54 or lower times the critical writing voltage at 20° C. is applied in the first direction of the spin-orbit torque wiring during data writing.

12. The data writing method according to claim 2, wherein when data is written in a temperature region of −40° C. or higher and 100° C. or lower, a voltage that is 1.2 times or more and 1.54 or lower times the critical writing voltage is applied in the first direction of the spin-orbit torque wiring.

13. The data writing method according to claim 3, wherein when data is written in a temperature region of −40° C. or higher and 100° C. or lower, a voltage that is 1.2 times or more and 1.54 or lower times the critical writing voltage is applied in the first direction of the spin-orbit torque wiring.

* * * * *